(12) United States Patent
Li et al.

(10) Patent No.: US 11,525,190 B2
(45) Date of Patent: Dec. 13, 2022

(54) METHOD FOR MAKING IRON TELLURIDE

(71) Applicants: Tsinghua University, Beijing (CN); HON HAI PRECISION INDUSTRY CO., LTD., New Taipei (TW)

(72) Inventors: Hao Li, Beijing (CN); Yang Wu, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 71 days.

(21) Appl. No.: 17/328,267

(22) Filed: May 24, 2021

(65) Prior Publication Data
US 2022/0307155 A1 Sep. 29, 2022

(30) Foreign Application Priority Data

Mar. 26, 2021 (CN) .......................... 202110327036.0

(51) Int. Cl.
*C30B 9/04* (2006.01)
*C30B 29/52* (2006.01)

(52) U.S. Cl.
CPC ................ *C30B 9/04* (2013.01); *C30B 29/52* (2013.01)

(58) Field of Classification Search
CPC .............. C30B 9/00; C30B 9/06; C30B 29/52
See application file for complete search history.

(56) References Cited

U.S. PATENT DOCUMENTS

| 5,196,908 | A  | * | 3/1993  | Kusunoki | ............... | H01L 29/10 257/E29.043 |
| 8,058,640 | B2 | * | 11/2011 | Lieber    | ............... | H01L 21/02513 257/14 |
| 8,154,002 | B2 | * | 4/2012  | Lieber    | ................ | H01L 29/0673 257/4 |
| 8,172,148 | B1 | * | 5/2012  | Cloutier  | ........... | G06K 19/06196 235/492 |
| 8,759,662 | B1 | * | 6/2014  | Nolas     | ...................... | H01L 35/34 136/238 |

(Continued)

FOREIGN PATENT DOCUMENTS

JP          5196908        *  8/1993

OTHER PUBLICATIONS

Kumar et al. "Study of Structural and Magnetotransport Properties of Fe(Te, Se) Single Crystals", Phys Status Solidi 2020 257 pp. 1-10.*

*Primary Examiner* — Robert M Kunemund
(74) *Attorney, Agent, or Firm* — ScienBiziP, P.C.

(57) ABSTRACT

The disclosure relates to a method for making an iron telluride including placing Fe, Bi, and Te in a reacting chamber as reacting materials. The reacting chamber is evacuated to be a vacuum with a pressure lower than 10 Pa. The reacting chamber is heated to a first temperature of 700 degrees Celsius to 900 degrees Celsius and keeping the first temperature for a period of 10 hours to 14 hours. Then the reacting chamber is cooled to a second temperature of 400 degrees Celsius to 700 degrees Celsius within 60 hours to 75 hours and keeping the second temperature for a period of 40 hours to 50 hours, to obtain a reaction product including a $FeTe_{0.9}$ single crystal. The $FeTe_{0.9}$ single crystal is separated from the reaction product.

15 Claims, 4 Drawing Sheets

(56) References Cited

U.S. PATENT DOCUMENTS

| | | | |
|---|---|---|---|
| 8,865,995 B2* | 10/2014 | Ren | H01L 35/34 |
| | | | 136/238 |
| 2014/0332753 A1* | 11/2014 | Xiao | H01L 29/775 |
| | | | 438/197 |
| 2016/0197085 A1* | 7/2016 | Ju | H01L 29/66545 |
| | | | 257/369 |

* cited by examiner

METHOD FOR MAKING IRON TELLURIDE

FIELD

The present application relates to metal compound materials, in particular to a method for making an iron telluride.

BACKGROUND

Transition metal telluride nanocrystals, such as cadmium telluride, lead telluride, and bismuth telluride, have attracted much attention due to their unique and excellent properties. The transition metal telluride nanocrystals have a wide range of applications in thermoelectric, magnetic, biomedical, and photovoltaic catalysis.

Among the transition metal telluride nanocrystals, iron telluride is an important semiconductor and has a wide range of applications in the fields of optoelectronic devices and thermoelectric devices. In the past decade, researchers have prepared various iron telluride nanostructures, such as quantum dots, nanorods, and nanosheets, through hydrothermal methods, solvothermal methods, or chemical vapor deposition methods. For example, the orthogonal iron ditelluride nanorods are prepared under a certain concentration of KOH solution by the hydrothermal methods. The hexadecylamine, trioctyl phosphine oxide, trioctyl phosphine, telluride powder and iron pentacarbonyl are used to prepare the iron ditelluride nanosheets by a thermal injection methods. However, these methods are relatively complicated, and the purity of iron telluride is not high.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
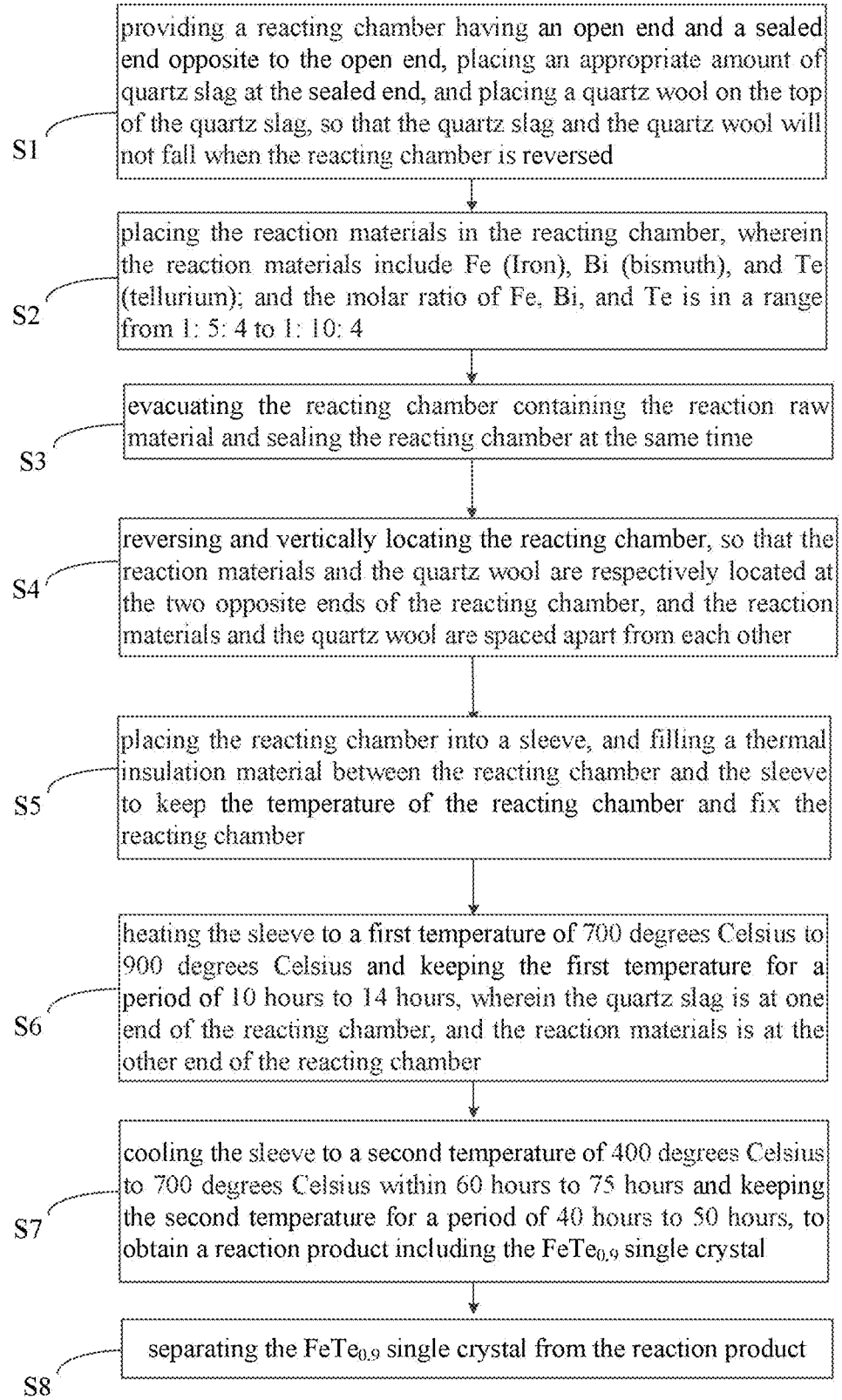
FIG. 1 shows a flowchart of a method for making an iron telluride according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not to be considered as limiting the scope of the embodiments described herein.

The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Figure 2:
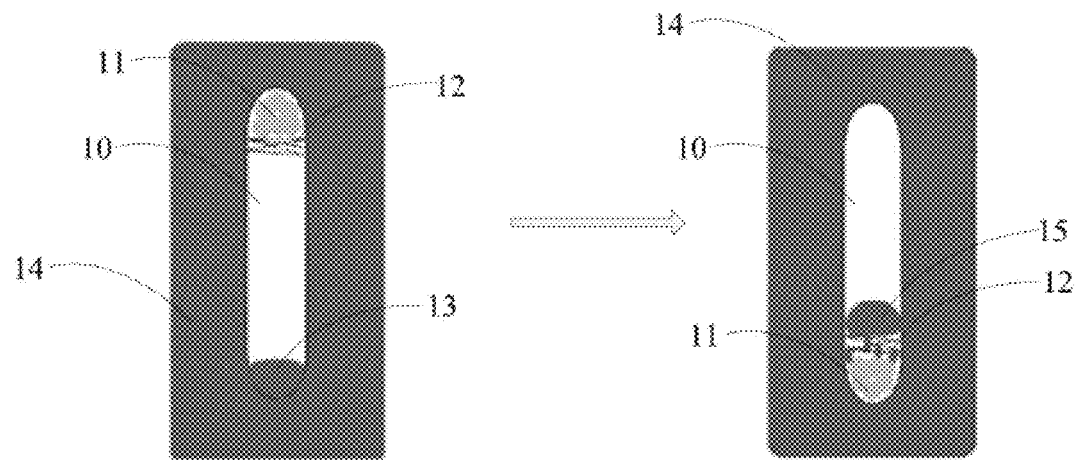
FIG. 2 shows a schematic section view of a device for making the iron telluride according to the present disclosure.

Referring to FIGS. 1-2, a method for making an iron telluride being a $FeTe_{0.9}$ single crystal includes the following steps:

S1: providing a reacting chamber 10 having an open end and a sealed end opposite to the open end, placing an appropriate amount of quartz slag 11 at the sealed end, and placing a quartz wool 12 on the top of the quartz slag 11, so that the quartz slag 11 and the quartz wool 12 will not fall when the reacting chamber 10 is reversed;

S2, placing the reaction materials 13 in the reacting chamber 10, wherein the reaction materials 13 include Fe (Iron), Bi (bismuth), and Te (tellurium); and the molar ratio of Bi, and Te is in a range from 1:5:4 to 1:10:4; S3, evacuating the reacting chamber 10 containing the reaction raw material 13 and sealing the reacting chamber 10 at the same time;

S4, reversing and vertically locating the reacting chamber 10, so that the reaction materials 13 and the quartz wool 12 are respectively located at the two opposite ends of the reacting chamber 10, and the reaction materials 13 and the quartz wool 12 are spaced apart from each other;

S5, placing the reacting chamber 10 into a sleeve 14, and filling a thermal insulation material between the reacting chamber 10 and the sleeve 14 to keep the temperature of the reacting chamber 10 and fix the reacting chamber 10;

S6, heating the sleeve 14 to a first temperature of 700 degrees Celsius to 900 degrees Celsius and keeping the first temperature for a period of 10 hours to 14 hours, wherein the quartz slag 11 is at one end of the reacting chamber 10, and the reaction materials 13 is at the other end of the reacting chamber 10;

S7, cooling the sleeve 14 to a second temperature of 400 degrees Celsius to 700 degrees Celsius within 60 hours to 75 hours and keeping the second temperature for a period of 40 hours to 50 hours, to obtain a reaction product 15 including the $FeTe_{0.9}$ single crystal; and S8, separating the $FeTe_{0.9}$ single crystal from the reaction product 15.

During step S1, the size and shape of the reacting chamber 10 are not limited. In one embodiment, the reacting chamber 10 is a quartz tube. The quartz slag 11 is located between the sealed end of the reacting chamber 10 and the quartz wool 12. The function of the quartz slag 11 and the quartz wool 12 is to separate the excess fluxing agent in the molten or liquid state. The quartz slag 11 and the quartz wool 12 are optional. If the quartz slag 11 and the quartz wool 12 are omitted, the reaction product 15 should be separated by special method, such as using a metal filter or ceramic filter.

The sizes of the quartz slag 11 and the quartz wool 12 are not limited, as long as they can be used for subsequent separation of excess molten or liquid fluxing agent. In one embodiment, the reacting chamber 10 is a quartz glass tube, the inner diameter of the quartz glass tube is about 8 millimeters, and the outer diameter is about 10 millimeters. The quartz glass tube is filled with the quartz slag 11 so that the quartz slag 11 form a support at the sealed end, and the support has a thickness in a range of about 0.5 centimeter to about 3 centimeters. In one embodiment, the thickness of the support is about 2 centimeters. The particle diameter of the quartz slag 11 is less than 1 millimeter. The quartz wool 12 forms a filter on the quartz slag 11, and the filter has a thickness in a range of about 0.5 centimeter to about 2 centimeters. In one embodiment, the thickness of the filter is about 1 centimeter. The diameter of the quartz wool 12 can be in a range of about 1 micrometer to about 10 micrometers. In one embodiment, the diameter of the quartz wool 12 is about 4 micrometers. The quartz slag 11 and the quartz wool 12 separate the $FeTe_{0.9}$ single crystal from the reaction product 15.

The method for preventing the quartz slag 11 and the quartz wool 12 from falling when reversing the reacting chamber 10 is to apply an external force, which acts on the quartz wool 12, and the direction of the external force is directed from the quartz wool 12 to the quartz slag 11. Thus the quartz wool 12 are compacted, so that the quartz slag 11 and the quartz wool 12 will not fall when the reacting chamber 10 is reversed and vertically located. In one embodiment, the quartz slag 11 is multiple quartz glass shards, and a gap is between adjacent quartz glass shards; and the quartz wool 12 is a refractory quartz wool.

During step S2, the Fe, the Bi, and the Te are all high purity. The purity of the Fe is greater than 99.9%, the purity of the Bi is greater than 99.99%, and the purity of the Te is greater than 99.99%. The Bi is a fluxing agent. In order to make the reaction materials 13 fully react, the molar ratio of the high-purity Fe, the high-purity Bi, and the high-purity Te is in a range from 1:5:4 to 1:10:4. In one embodiment, the molar ratio of Fe, Bi, and Te is 1:7:4, and the reaction materials 13 can be fully reacted.

During step S3, the reacting chamber 10 is evacuated by a mechanical pump, so that the reacting chamber 10 is evacuated to be vacuum with a pressure lower than 10 Pa. The open end of the reacting chamber 10 is sealed by the natural gas-oxygen flame heating method, so that the reacting chamber 10 becomes a fully enclosed container. In one embodiment, the pressure in the reacting chamber 10 can be less than 1 Pa. The natural gas can be replaced by the propane gas or the hydrogen gas. Thus, the reacting chamber 10 can also be sealed by flame heating methods, such as propane gas-oxygen or hydrogen-oxygen. While sealing the reacting chamber 10, the pressure in the reacting chamber 10 is ensured to be less than 10 Pa. In one embodiment, a vacuum melting and sealing machine is used to fuse and seal the quartz glass tube in a vacuum environment to ensure the pressure inside the quartz glass tube to be less than 1 Pa, so as to prevent the reaction materials 13 from being oxidized by air.

During step S4, when the reacting chamber 10 is fused and sealed in the step S3, the temperature of the reacting chamber 10 will increase. After the reacting chamber 10 is cooled, the reacting chamber 10 is reversed and vertically located, so that the reaction materials 13 are located at the bottom of the reacting chamber 10, and the quartz slag 11 and the quartz wool 12 are located at the top of the reacting chamber 10.

During step S5, the encapsulated reacting chamber 10 is placed into the sleeve 14, and the sleeve 14 is used as a thermal insulation container to ensure that the temperature of the reaction product 15 in the reacting chamber 10 is constant during subsequent centrifugation. In one embodiment, the material of the sleeve 14 is steel, and the sleeve 14 is a steel sleeve. The type of the thermal insulation material is not limited, such as fire-resistant cotton or the like. In one embodiment, the thermal insulation material is a refractory quartz wool, After placing the encapsulated reacting chamber 10 into the sleeve 14, the thermal insulation material is filled at least between the two ends of the sleeve 14 and the reacting chamber 10 for thermal insulation, and the stability of the reacting chamber 10 can be improved. The reacting chamber 10 is vertically located in the sleeve 14, the quartz slag 11 and the quartz wool 12 are still at the top of the reacting chamber 10, and the reaction materials 13 is still at the bottom of the reacting chamber 10.

During step S6 and step S7, the sleeve 14, having the reacting chamber 10 therein, is placed in a heating furnace, such as a muffle furnace. In one embodiment, the reacting chamber 10 is heated by the heating furnace to a point where the inside thereof reaches 800 degrees Celsius and kept at 800 degrees Celsius for 12 hours, then slowly cooled to 600 degrees Celsius within 72 hours, and kept at 600 degrees Celsius for 48 hours. During heating and cooling, the reacting chamber 10 is vertically located in the sleeve 14, the reacting materials 13 are kept at the bottom of the reacting chamber 10 and the quartz slag 11 and the quartz wool 12 are kept at the top of the reacting chamber 10. The reaction product 15 includes an iron telluride compound and a liquid Bi fluxing agent, and the iron telluride compound is the $FeTe_{0.9}$ single crystal. In one embodiment, the sleeve 14 with the reacting chamber 10 is located into a box-type muffle furnace with a uniform temperature zone and controllable temperature.

During step S8, the $FeTe_{0.9}$ single crystal is separated from the reaction product 15 by reversing the sleeve 14. In one embodiment, the $FeTe_{0.9}$ single crystal is separated from the reaction product 15 by centrifugation. In one embodiment, the sleeve 14 is taken out of the heating furnace, and the sleeve 14 is reversed and vertically located, so that the quartz slag 11 and quartz wool 12 is located at the bottom of the reacting chamber 10. Then the reacting chamber 10 is located in a centrifuge (not shown), and centrifuged at 2000 rpm to 3000 rpm for 100 seconds to 200 seconds. During the centrifugation process, the quartz slag 11 and the quartz wool 12 are at the bottom of the reacting chamber 10. The temperature of the reacting chamber 10 is higher than the melting point of Bi due to the function of the sleeve 14. At this time, the Bi fluxing agent is still in the liquid state. The Bi fluxing agent passes through the gap in the quartz wool 12 and is centrifuged into the quartz slag 11, and the $FeTe_{0.9}$ single crystal in the reaction product 15 is in a solid state. The $FeTe_{0.9}$ single crystal is blocked by the quartz wool 12, so that the solid $FeTe_{0.9}$ single crystal is separated from the Bi fluxing agent.

In one embodiment, after keeping the second temperature for the period of 40 hours to 50 hours, the sleeve 14 is reversed and vertically located at 500 degrees Celsius to 700 degrees Celsius, and quickly transferred to the centrifuge. In one embodiment, after keeping the second temperature for the period of 40 hours to 50 hours, the sleeve 14 is reversed and vertically located at 600 degrees Celsius, and quickly transferred to the centrifuge to be centrifuged at 2500 rpm for 150 seconds.

After the centrifugation, the reacting chamber 10 is quickly taken out of the sleeve 14, and the temperature is naturally cooled to room temperature in the air, and then the $FeTe_{0.9}$ single crystal on the quartz wool 12 is taken out. Other methods can also be used to cool the reacting chamber 10. Further, the $FeTe_{0.9}$ single crystal is washed with deionized water, so as to obtain a pure $FeTe_{0.9}$ single crystal.

The present application adopts flux method to prepare $FeTe_{0.9}$ single crystal, and Bi is the fluxing agent. In the reaction process of the step S6 and the step S7, the fluxing agent Bi enables the Te of the iron-tellurium compound (Fe—Te compound) in the reaction product 15 to be extracted to the greatest extent, so that the molar ratio of Fe to Te is 1:0.9, thereby obtaining the $FeTe_{0.9}$ single crystal.

Figure 3:
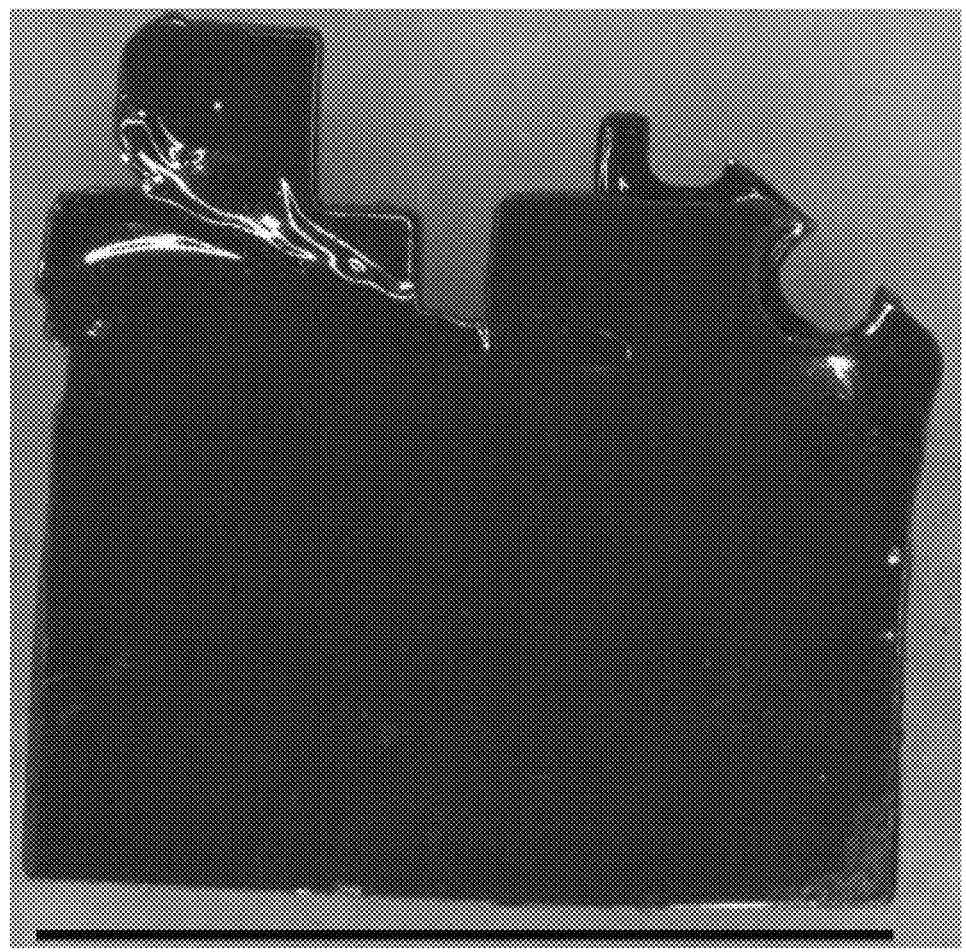
FIG. 3 shows an optical photo of a $FeTe_{0.9}$ single crystal made by the method shown in FIG. 1.

FIG. 3 shows an optical photo of the $FeTe_{0.9}$ single crystal prepared by the method for making the iron telluride, and the length of the scale below the $FeTe_{0.9}$ single crystal in FIG. 3 is 5 millimeters. It can be seen from FIG. 3 that the $FeTe_{0.9}$ single crystal has a sheet-like shape, a length of 5 millimeters, and a smooth and bright surface.

Figure 4:
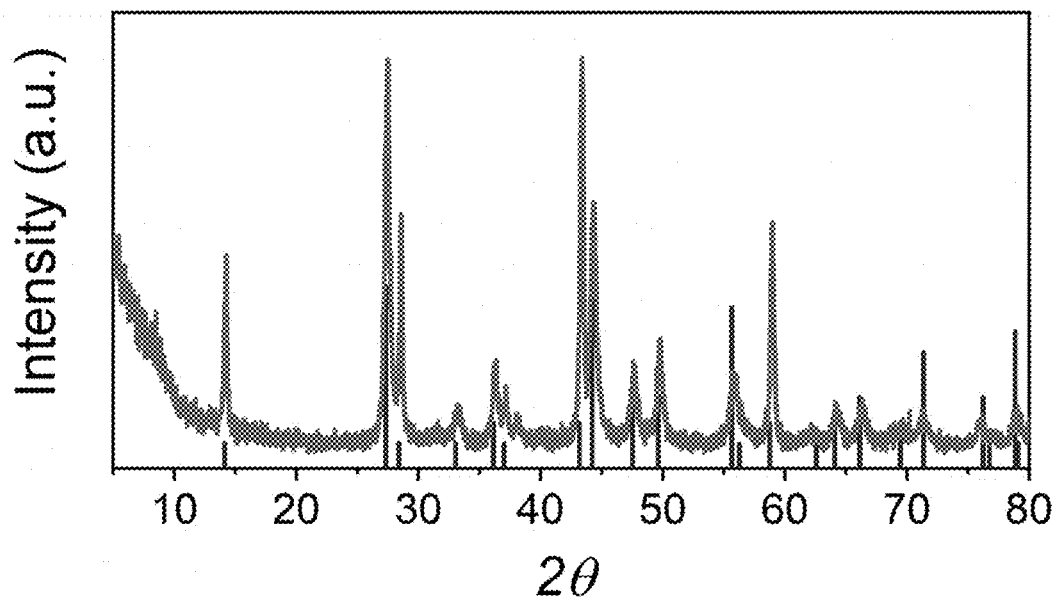
FIG. 4 shows an X-ray diffraction (XRD) spectrum of the $FeTe_{0.9}$ single crystal made by the method shown in FIG. 1.

FIG. 4 shows the powder X-ray diffraction spectrum of the $FeTe_{0.9}$ single crystal. In FIG. 4, the bottom vertical line is the standard powder X-ray diffraction spectrum of P4/nmm-$FeTe_{0.9}$, wherein PDF-#07-0140 is P4/nmm-$FeTe_{0.9}$ powder X-ray diffraction standard spectrum number. It can be seen from FIG. 4 that the powder X-ray diffraction result of the $FeTe_{0.9}$ single crystal is consistent with the peak position of the standard powder X-ray diffraction spectrum (PDF-407-0140) of $FeTe_{0.9}$ whose space group is P4/nmm, which can prove that the product on the quartz wool 12 after centrifugation is the $FeTe_{0.9}$ single crystal, and the space group of the $FeTe_{0.9}$ single crystal is also P4/nmm. In addition, the powder X-ray diffraction pattern of the $FeTe_{0.9}$ single crystal in FIG. 4 has no impurity peaks, which proves that the high-quality, P4/nmm-$FeTe_{0.9}$ single crystal has been successfully synthesized by the method for making the iron telluride of present application.

The method for making the iron telluride has the following advantages: first, using Bi as a fluxing agent, the tellurium in the iron-tellurium compound is taken out to the greatest extent, so that the molar ratio of iron to tellurium is 1:0.9, thus the $FeTe_{0.9}$ single crystal is obtained; second, the method is simple, and the $FeTe_{0.9}$ single crystal has a higher purity.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method of making iron telluride, comprising:
providing a reacting chamber defining an open end and a sealed end opposite to the open end;
placing quartz slags at the sealed end and quartz wool on the top of the quartz slags;
placing reaction materials in the reacting chamber, wherein the reaction materials comprise Fe (Iron), Bi (bismuth), and Te (tellurium); and a molar ratio of Fe, Bi, and Te is in a range from 1:5:4 to 1:10:4;
evacuating the reacting chamber and sealing the open end;
flipping the reacting chamber in a sleeve, so that, due to gravity, the reaction materials are at a bottom of the reacting chamber, and the quartz slag and the quartz wool are at a top of the reacting chamber;
heating the sleeve to a first temperature of 700 degrees Celsius to 900 degrees Celsius and maintaining the sleeve at the first temperature for a period of 10 hours to 14 hours;
cooling the sleeve to a second temperature of 400 degrees Celsius to 700 degrees Celsius within 60 hours to 75 hours and maintaining the sleeve at the second temperature for a period of 40 hours to 50 hours, to obtain a reaction product comprising $FeTe_{0.9}$ single crystals; and
separating the $FeTe_{0.9}$ single crystals from the reaction product by flipping the sleeve.

2. The method of claim 1, wherein the iron telluride comprises $FeTe_{0.9}$ single crystals.

3. The method of claim 1, wherein the quartz slags are placed between the sealed end and the quartz wool.

4. The method of claim 1, wherein a molar ratio of Fe, Bi, and Te is 1:7:4.

5. The method of claim 1, wherein the reacting chamber is evacuated to a vacuum than 10 Pa.

6. The method of claim 5, wherein the vacuum is lower than 1 Pa.

7. The method of claim 1, wherein a method of sealing the open end comprises fast heating the open end by a flame.

8. The method of claim 1, wherein flipping the reacting chamber in the sleeve comprises filling fire-resistant cotton between the reacting chamber and the sleeve.

9. The method of claim 1, wherein separating the $FeTe_{0.9}$ single crystals from the reaction product further comprises centrifuging the reaction product.

10. The method of claim 9, wherein the reaction product is centrifuged at 2000 rpm to 3000 rpm for 100 seconds to 200 seconds.

11. The method of claim 10, wherein the reaction product is centrifuged at 2500 rpm for 150 seconds.

12. A method for making an iron telluride, comprising:
placing Fe (Iron), Bi (bismuth), and Te (tellurium) in a reacting chamber as reacting materials;
evacuating the reacting chamber to be vacuum with a pressure lower than 10 Pa;
heating the reacting chamber to a first temperature of 700 degrees Celsius to 900 degrees Celsius and keeping the first temperature for a period of 10 hours to 14 hours;
cooling the reacting chamber to a second temperature of 400 degrees Celsius to 700 degrees Celsius within 60 hours to 75 hours and keeping the second temperature for a period of 40 hours to 50 hours, to obtain a reaction product including a $FeTe_{0.9}$ single crystal; and
separating the $FeTe_{0.9}$ single crystal from the reaction product.

13. The method of claim 12, wherein the iron telluride is a $FeTe_{0.9}$ single crystal.

14. The method of claim 12, wherein a molar ratio of Fe, Bi, and Te is in a range from 1:5:4 to 1:10:4.

15. The method of claim 14, wherein a molar ratio of Fe, Bi, and Te is 1:7:4.

* * * * *